United States Patent
Takahashi et al.

[11] Patent Number: 6,002,162
[45] Date of Patent: Dec. 14, 1999

[54] OVERALL VPP WELL FORM

[75] Inventors: Yasushi Takahashi, Urawa; Tsutomu Takahashi, Tachikawa; Koji Arai, Kodaira, all of Japan; Shinji Bessho; Shunichi Sukegawa, both of Plano, Tex.; Masayuki Hira, Dallas, Tex.

[73] Assignee: Texas Instruments Incorporated, Dallas, Tex.

[21] Appl. No.: 09/090,721

[22] Filed: Jun. 4, 1998

[30] Foreign Application Priority Data

May 2, 1997 [JP] Japan ................................. 9-130272

[51] Int. Cl.⁶ ................................................... H01L 29/72
[52] U.S. Cl. ........................ 257/544; 257/296; 257/299; 257/328; 257/401; 257/509
[58] Field of Search .................... 257/296, 299, 257/328, 401, 509, 544

[56] References Cited

U.S. PATENT DOCUMENTS 5,753,958  5/1998  Burr et al. ............................. 257/391

*Primary Examiner*—Edward Wojciechowicz
*Attorney, Agent, or Firm*—William B. Kemplar; Richard L. Donaldson

[57] ABSTRACT

Realizing a reduction of the layout surface area by rendering unnecessary the region used for well isolation. In this DRAM, a triple well construction is used, and all of the regions for the unit memory cell array MA, the word line driver bank WDB, the sense amplifier bank SAB, and the cross area CR are surrounded by a lower layer N-type deep (deep layer) well 12. A back bias VPP corresponding to the power supply voltage of the word line driver is applied to the N well 14, and a back bias VBB corresponding to the characteristics of the memory cell are applied to the P well 16. In the N well 14, in regard to the P-type MOS transistors of the sense amplifier that undergo the substrate bias effect due to the back bias VPP, the threshold voltage is set to a low value so as to cancel that bias effect. Also, in the P well 16, in regard to the N-type MOS transistors of the sense amplifiers that undergo the substrate bias effect due to the back bias VBB, the threshold voltage is designed to a low value so as to cancel that bias effect.

3 Claims, 9 Drawing Sheets

OVERALL VPP WELL FORM

FIELD OF THE INVENTION

This invention relates to a semiconductor device, and specifically, it relates to a semiconductor device such as a DRAM (dynamic random access memory).

BACKGROUND OF THE INVENTION

Generally, in a DRAM (dynamic random access memory) memory cell array, as is shown in FIG. 11, a single memory cell MCij is arranged (connected) at the intersection point of the word line WLi that is provided in each row and the bit line BLj that is provided in each column. Each memory cell MCij is constructed of a single N-type MOS transistor Qij and a single cell capacitor Cij. Each word line WLi is connected to the word line driver WDi of each row, and each bit line BLj is connected to the sense amplifier SAj of each column. The construction of one portion of the memory cell array shown in FIG. 11 is shown simplified for the purpose of facilitating the explanation.

When writing to the memory cell MCij is conducted, the word line driver WDi turns on the transistor Qij by driving to the potential to the H level or activating the word line WLi, and simultaneously with this, the sense amplifier SAj places the potential of the bit line BLj at the H level VDL or the L level VSS in response to the write information ("1" or "0"). In this way, the cell capacitor Cij receives a charging voltage of VDL or VSS. After this, the word line driver WDi lowers the word line WLi to the L level VSS, and the transistor Qij is turned OFF. As a result of this, a charging voltage or a charge of "1" VDL or "0" VSS is maintained at the cell capacitor Cij.

When reading is conducted, the sense amplifier SAj temporarily precharges the bit line BLj beforehand to a fixed potential (generally, VDL/2), and the word line driver WDi turns the transistor Qij ON by activating or driving the word line WLi to an H level. In this way, the bit line BLj and the cell capacitor Cij are short-circuited, and the potential on the bit line BLJ is slightly changed from the precharge level in response to the accumulated charge of the cell capacitor Cij. The stored information of the memory cell MCij is recognized by means of the sense amplifier SAj detecting and amplifying this slight potential change on this bit line BLj.

Incidentally, with a large-scale DRAM such as, for example, the 64 Mb class, a memory cell array construction is used wherein the memory cell array within a single chip is divided into multiple blocks or submatrices, and the memory cell array within the respective submatrices are divided into multiple memory cell array units.

Within each submatrix, a fixed number of memory cell array units are placed at a fixed spacing and arranged in a matrix form. Also, as is shown in FIG. 12, adjacent to each memory cell array unit MA, for example, the collector circuits (word line driver banks) WDB, WDB are arranged relatively opposite on both the left and right sides, and the collector circuits (sense amplifier banks) SAB, SAB are arranged relatively opposite on both the upper and lower sides. Also, the cross areas CR are provided diagonally next to each memory cell array unit MA.

In FIG. 12, for purposes of simplification of the illustration, only the layout of the memory cell array unit MA of four units (2 vertical×2 horizontal) that are relatively adjacent and their peripheral circuits is shown.

Within the memory cell array unit MA, the prescribed number (rows) of bit line pairs BL/BL- and the prescribed number (columns) of word lines WL are arranged in a matrix form, and memory cells MC are connected at the intersection point of each bit line BL (also each complementary bit line BL- and each word line. Each word line WL within the array MA is connected to the corresponding word line driver WD that is arranged in the word line driver banks WDB, WDB for both the left and right sides. Also, each bit line/each complementary bit line within the array MA is connected to the corresponding sense amplifier SA that is arranged in the sense amplifier banks SAB, SAB on both the upper and lower sides.

In each cross area CR are provided the drivers for the purpose of writing to the sense amplifiers SA within the connected sense amplifier banks SAB, and the drivers and the like (not illustrated) for the purpose of driving the word lines drivers WD within the connected word line driver banks WDB, and the like.

A typical partial cross-sectional view of the important sections is shown in FIG. 13 in regard to the line A—A' of FIG. 12. This cross-sectional construction shows the well construction in the vicinity of the boundary of the memory cell array unit MA and the sense amplifier bank SAB.

In this DRAM, a triple well construction is used, and an N-type deep (deep layer) well 102 is layered under the region for the memory cell array unit MA and the region for the word line driver bank WDB (not illustrated in FIG. 13). The area in which this N deep well 102 is distributed (hatching section) is shown in a planar view in FIG. 14.

In FIG. 13, the memory cell array unit MA is formed in the P well 104, which is the P-type region. In other words, each N-type MOS transistor and cell capacitor (not illustrated) that construct the prescribed number of memory cells that are contained in the unit memory cell array MA are formed in the surface and on the surface of the P well 104.

The sense amplifier bank SAB is constructed across the N well 106, which is the N-type region of the center section, and the pair of P wells 108, 110 that are on both sides of that. These wells 106, 108, 110 are formed without the interposition of a deep well on the main surface of the P-type silicon substrate 100. Among the elements that construct the circuit for the sense amplifier SA, the P-type MOS transistors are formed in the N-type well 106, and the N-type MOS transistors are formed in the P-type wells 108, 110.

The region PG used for well isolation that is made up of the N well 112 is arranged between the unit memory cell array MA and the sense amplifier bank SAB. The N deep well 102 that is arranged under the unit memory cell array MA and the word line driver bank WDB extends to under the N well 112 used for this well isolation.

In this type of construction, the back bias of the voltage VPP (for example, 3.8 V) is supplied to the N deep well 102 by means of the N well (not illustrated) of the word line driver bank WDB. Here, VPP is equivalent to the power supply voltage VPP used for the word line drive that is supplied to the P-type MOS transistor that is formed in the N well of the word line driver bank, and VPP is also applied as a back bias to the N well of the word line driver bank WDB.

A back bias of the voltage VBB (for example, −1.0 V) that is independent from the peripheral circuit section is supplied to the P well 104 of the unit memory cell array MA. Because the P well 104 of this array is electrically isolated from the P well of the peripheral circuit section by means of the well isolating region 112, the optimum back bias for the pause characteristics of the memory cell becomes selectable.

At the sense amplifier bank SAB, a back bias that is equal to the sensing drive voltage VDL (for example, 2.2 V) for the H level side is supplied to the N well 106 in which the P-type MOS transistors are provided, and a back bias that is equal to the sensing drive voltage VSS (for example, 0 V) for the L level side is supplied to the P wells 108, 110 in which the N-type MOS transistors are provided.

A back bias voltage VPP that is the same as that of the N deep well 102 is supplied to the N well 112 of the well isolation region PG.

The boundary section between the cross area CR, the unit memory cell array MA, and the word line driver bank WDM are also of the same cross-sectional construction as mentioned above, and the same type of back bias as mentioned above is supplied to each section.

In the DRAM construction used in the past such as mentioned above, the well isolation region PG is provided in the boundary sections of the unit memory cell array MA and the sense amplifier bank SAB, and the boundary section between the word line driver or bank WDM and the cross area CR, respectively. For example, when the sense amplifier bank SAB is designed to a width size of 40 μm, a width of 7 μm is selected for the well isolation regions PG. Therefore,. a space with a width of 14 μm is taken up for both sides of the sense amplifier section. Because of this, the entire submatrix body, and by extension, the layout surface area of the entire chip, is made large.

This invention was made considering these problems, and its purpose is to offer a semiconductor device that realizes a reduction of the layout surface area by making unnecessary the regions used for well isolation such as mentioned above.

SUMMARY OF THE INVENTION

In order to achieve the above-mentioned purposes, the first semiconductor device of this invention has a semiconductor substrate of a first conductor type, a semiconductor layer of a second conductor type that is formed on the above-mentioned semiconductor substrate, one or multiple semiconductor regions of the first semiconductor type and one or multiple semiconductor regions of the second conductor type that are aligned on top of the above-mentioned semiconductor layer isolated from the above-mentioned semiconductor substrate, one or multiple MOS transistors of the second semiconductor type that are formed within the respective semiconductor regions of the above-mentioned first semiconductor type; one or multiple MOS transistors of the first semiconductor type that are formed within the respective semiconductor regions of the above-mentioned second semiconductor type, along with applying a common first back bias to the respective semiconductor regions of the above-mentioned first conductor type, a common second back bias is applied to the above-mentioned semiconductor layer and the respective semiconductor regions of the above-mentioned second conductor type; also, it is designed so that, in at least one of the semiconductor regions of the above-mentioned first conductor type, the threshold voltage for the MOS transistor of at least one of the above-mentioned MOS transistors of the second conductor type cancels the substrate bias by means of the above-mentioned first back bias, and in at least one of the semiconductor regions of the above-mentioned second conductor type the threshold voltage for at least one of the MOS transistors of the above-mentioned first conductor type cancels the substrate bias effect by means of the above-mentioned second back bias.

Also, as for the second semiconductor device of this invention, in the above-mentioned first semiconductor device, a single memory cell array section and a section of one or multiple peripheral circuit sections that are connected to the above-mentioned memory cell array section are contained within at least one of the semiconductor regions of the above-mentioned first conductor type, and is designed so that the threshold voltage of at least one of the MOS transistors of the above-mentioned second conductor type of the above-mentioned peripheral section cancels the substrate bias effect by means of the above-mentioned first back bias.

Also, as for the third semiconductor device of this invention, in the above-mentioned second semiconductor device, the remaining portion of the above-mentioned peripheral circuit section is provided within the semiconductor region of the above-mentioned second conductor type that is adjacent to a portion of the region of the above-mentioned peripheral circuit that is formed within the semiconductor region of the above-mentioned first conductor type, and is designed so that the threshold voltage of at least one of the MOS transistors of the above-mentioned first conductor type of the above-mentioned peripheral circuit section cancels the substrate bias effect by means of the above-mentioned second back bias.

REFERENCE NUMERALS AND SYMBOLS AS SHOWN IN THE DRAWINGS

| | |
|---|---|
| 10 | P-type silicon substrate |
| 12 | N deep well |
| 14 | P well |
| 16 | N well |
| MC | Memory cell |
| MA | Unit memory cell array |
| SA | Sense amplifier |
| SAB | Sense amplifier bank |
| WD | Word line driver |
| WDB | Word line driver bank |
| CR | Cross area |
| TR1, TR2, . . . | Transistor |

DESCRIPTION OF THE EMBODIMENTS

Below, embodiments of this invention are explained with reference to FIGS. 1–10.

Figure 1:
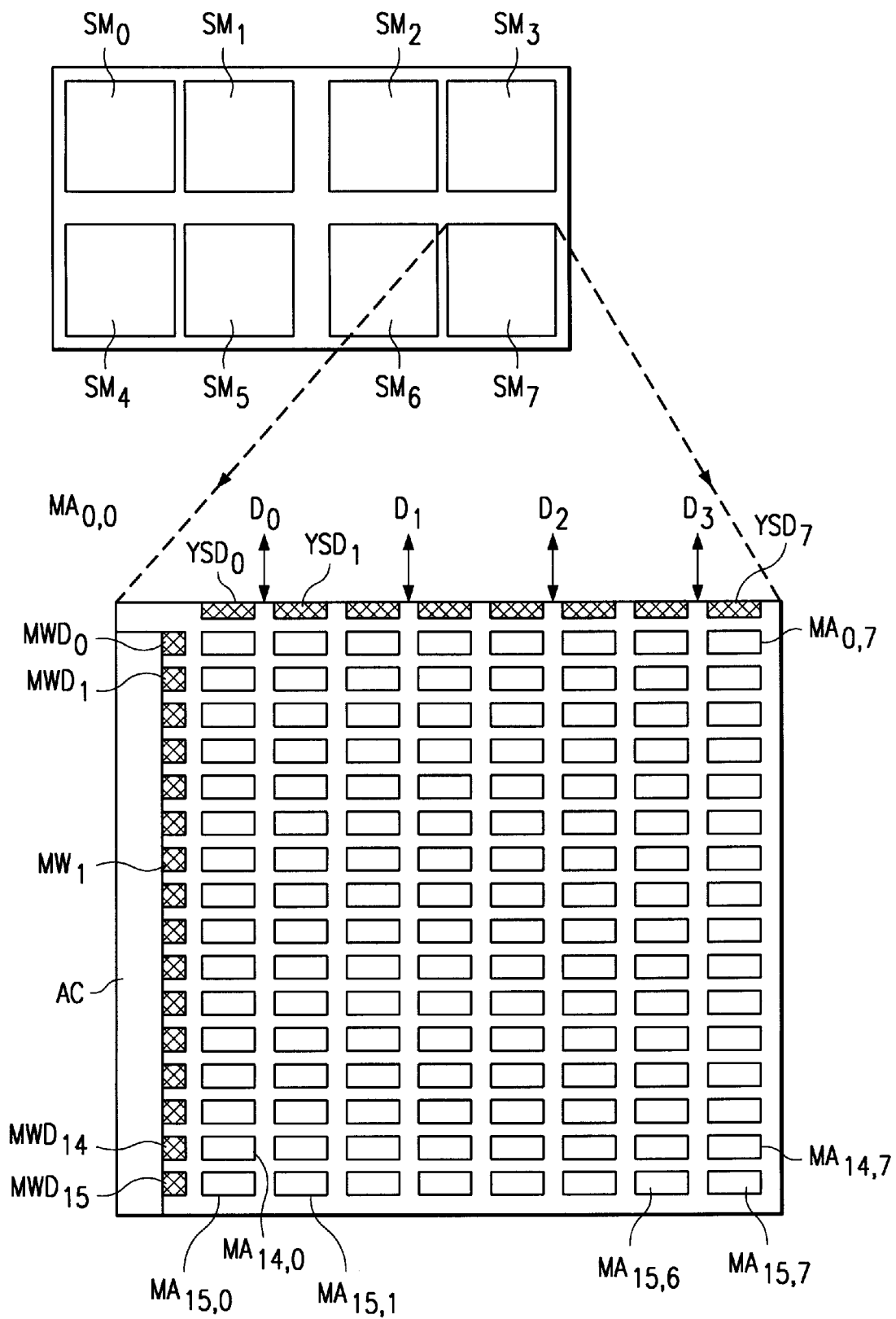
FIG. 1 is a figure showing the layout of the memory cell array of a DRAM according to one embodiment of this invention.

The layout of a memory cell array within a DRAM according to embodiment of this invention is shown in FIG. 1.

This DRAM has, for example, a storage capacity of 64 Mb, the memory array (64 Mb) within one chip (semiconductor substrate) is divided into 8 units of 8 Mb blocks or submatrices SM, and the memory array (8 Mb) within each submatrix SM is divided into 128 units of 64 Kb arrays or unit memory cell arrays MA.

Within each submatrix SM, the 128 units of a unit memory cell array MA are discretely arranged by placing them at a fixed spacing within a matrix pattern of 16 rows×8 columns. An array controller AC is installed at the left edge of each submatrix SM, and the main word line drivers MWD for each row portion are installed in a single line in the vertical direction to the inside of this controller AC. YS drivers YSD are arranged in each column in a single line in the horizontal direction for the purpose of selectively driving the Y address line YS.

Figure 2:
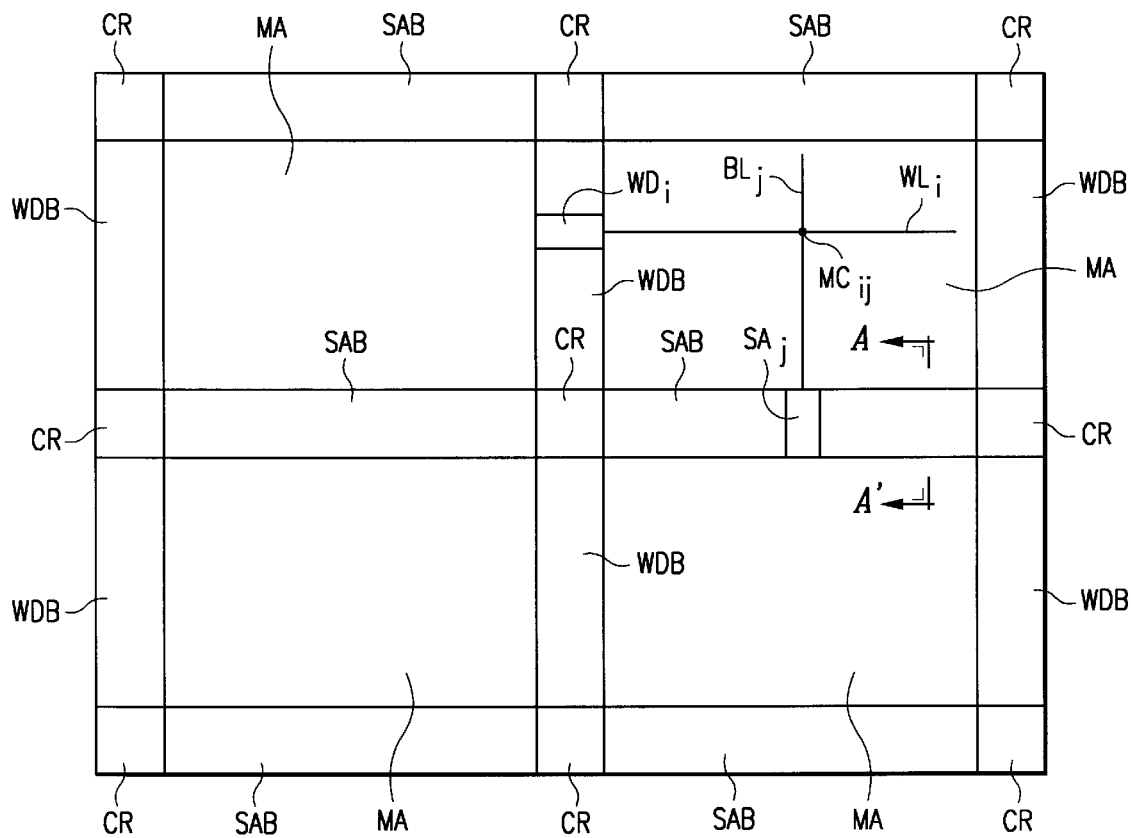
FIG. 2 is a figure showing the layout of a unit memory cell array section and a peripheral circuit section in a submatrix of the embodiment.

The layout of the region for the adjacently contacting 4 units (2 vertical×2 horizontal) unit memory cell arrays MA and the region for the peripheral circuit section are shown in FIG. 2 as one portion within the submatrix SM.

Within the unit memory cell array MA, for example, the bit line pair BL/BL- for the 256 assemblies (rows) and the word lines WL for the 256 lines (columns) are wired in a matrix form, and a memory cell MC is connected to the intersection point of each bit line BL (or each complementary bit line BL-) and each word line.

The respective 128 word line drivers WD are arranged in "island" form in the word line driver banks WDB, WDB on both the right and left sides. Among the 256 word lines WL within the unit memory cell array MA, for example, the odd-numbered word lines WL (half of the total 128 lines) are respectively connected to the 128 word line drivers WD within the sub-word line driver bank WDB of the left side, and the remaining even-numbered word lines WL (half, 128 lines) are respectively connected to the 128 word line drivers WD within the word line driver bank WDB on the right side.

The respective 128 sense amplifiers SA are arranged in island form in the sense amplifier banks SAB, SAB on both the upper and lower side of each unit memory cell array MA. Among the 256 bit line pairs within the unit memory cell arrays MA, for example, the odd-numbered bit line pairs (half, 128 pairs) are respectively connected to the 128 sense amplifiers SA within the upper side sense amplifier bank SAB, and the remaining even-numbered bit line pairs (half, 128 pairs) are respectively connected to the 128 sense amplifiers SA within the lower side sense amplifier bank SAB.

In each cross area CR are provided a driver for the purpose of driving the sense amplifiers SA within the adjacent sense amplifier bank SAB, an I/O switch for the purpose of connecting the local data input/output line that is commonly connected to these sense amplifiers, an FX driver for the purpose of selectively activating the word line driver WD within the connected word line driver bank WDB, and the like.

Figure 3:
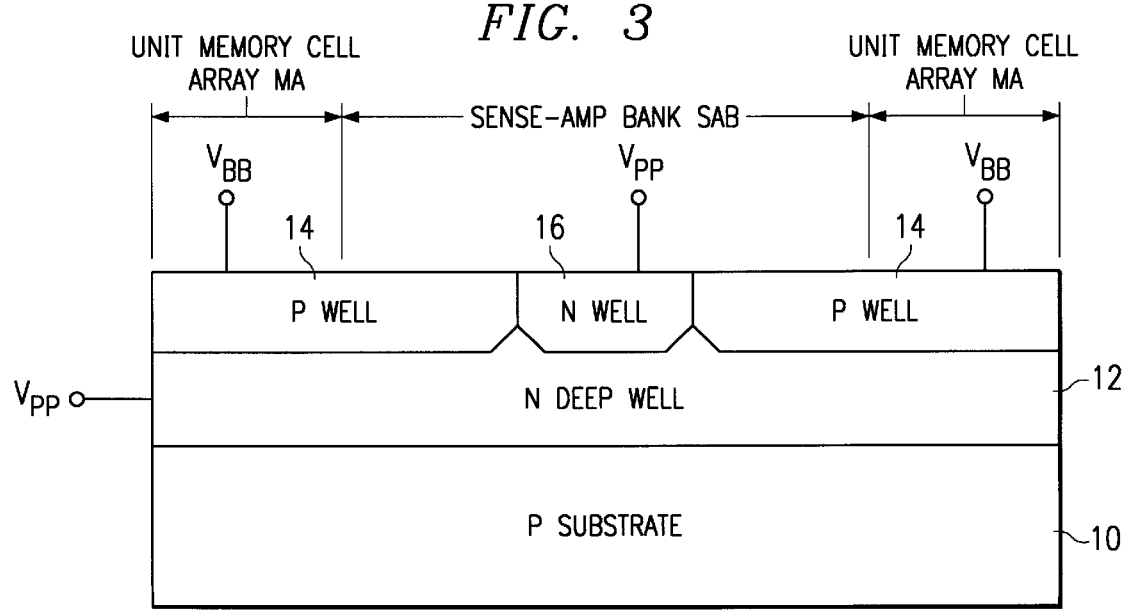
FIG. 3 is an abbreviated cross section of FIG. 2 through line A—A'.

A typical cross-sectional construction of the important section in regard to line A—A' of FIG. 2 is shown in FIG. 3. This cross-sectional construction shows the well construction in the vicinity of the boundary of the unit memory cell array MA and the sense amplifier bank SAB.

A triple well construction is used in the DRAM of this embodiment, and all of the regions for the unit memory cell array MA, the word line driver bank WDB, the sense amplifier bank SAB, and the cross area CR are surrounded by the bottom layer N-type deep (deep layer) well 12. The area (hatching section) in which this N deep well 12 is distributed is shown in planar form in FIG. 4.

Figure 4:
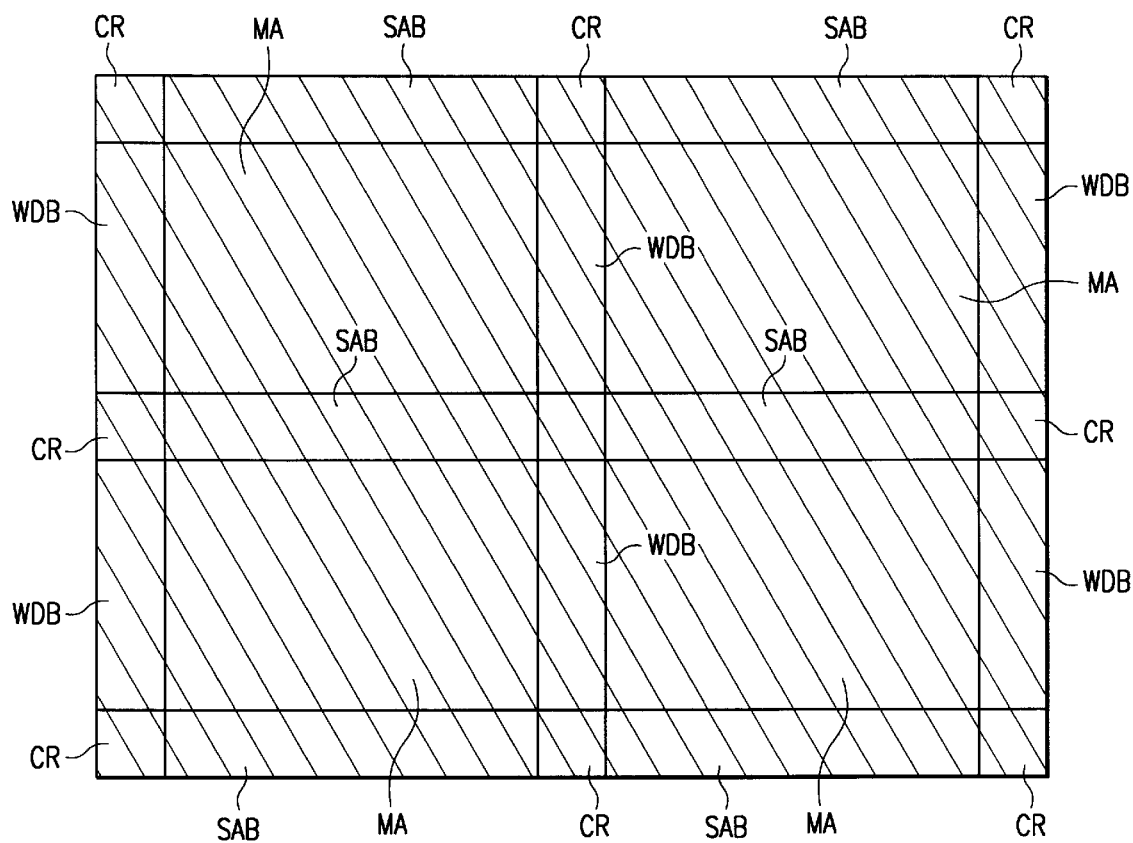
FIG. 4 is a figure showing the typical area in which the deep well is distributed in the embodiment.

As is clearly shown in FIG. 3 and FIG. 4, with the DRAM of this embodiment, because an isolation region PG is not provided in the well boundary section, the layout surface area is reduced by that amount, and a downsizing of the chip is realized.

The N deep well 12 is formed to the prescribed depth (for example, 3 $\mu$m) by the ion implantation of, for example, phosphorus, in the main face of the P-type silicon substrate 10. Then, the P well and the N well in the layout corresponding to the regions for each section (MA, WDB, SAB, CR) are formed in the surface of this N deep well 12 to a prescribed depth (for example, 1.6 $\mu$m) by means of the impurity diffusion technology of the twin well method.

In FIG. 3, the unit memory cell array MA is provided in the prescribed section of the P well 14. 64K units of the memory cell are formed in the surface and on the surface of the P well 14 within the section for this unit memory cell array MA.

Figure 5:
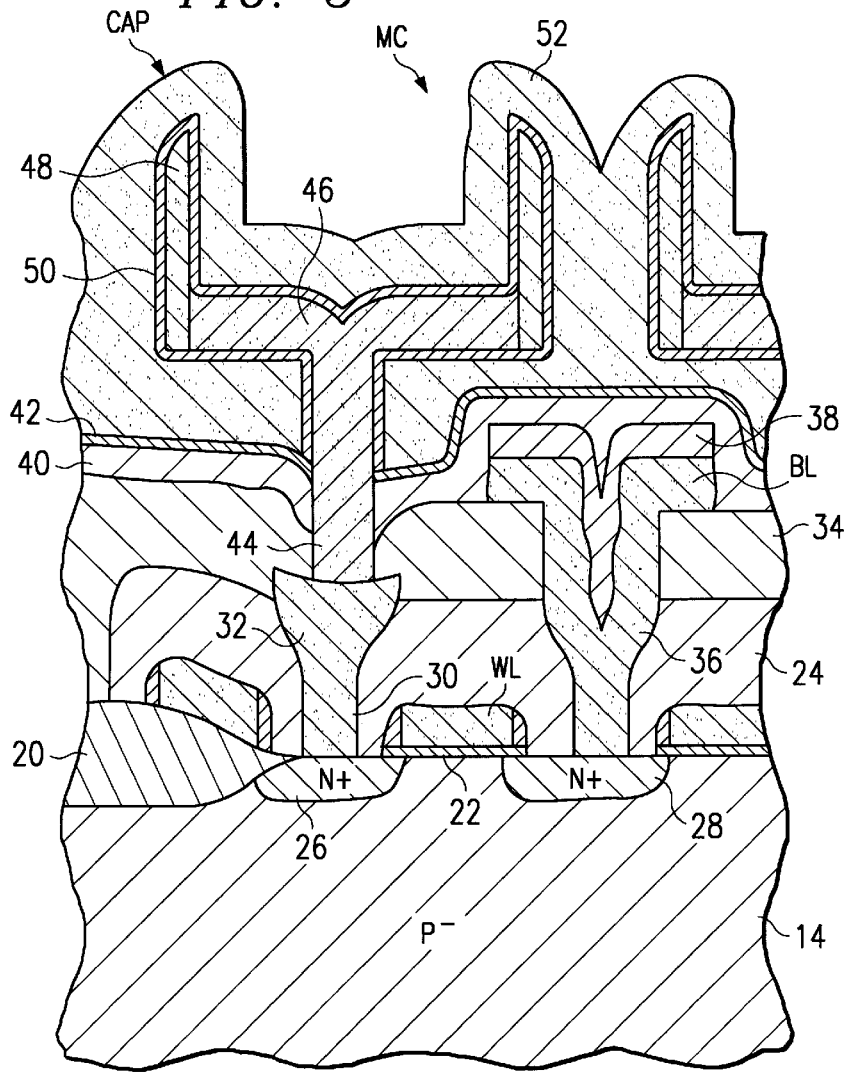
FIG. 5 is a partial cross section showing the construction of a memory cell within a memory cell array section in the embodiment.

The construction of the memory cell MC within the unit memory cell array MA is shown in FIG. 5. This memory cell MC has the memory cell construction of a stacked capacitor cell. In the construction of this memory cell, the gate oxide film (22) is formed in the element region that is isolated by means of the field oxide film 20 on top of the P well 14, and the word line WL made of polysilicon or the like and an insulation film 24 of an $SiO_2$ layer or the like are formed on top of this. Also, the $N^+$type semiconductor regions 26 (source region) and 28 (drain region) are formed by means of a self aligning method in which the word line WL is used as a mask.

Contact hole 30 is formed in one portion of the insulation film 24, polysilicon is filled in this contact hole 30, forming plug 32 for a storage node. The $SiO_2$ layer 34 is formed on top of the insulation film 24, the contact hole 36 is formed in one portion of that $SiO_2$ layer 34 and the insulating film 24, a conductive material such as polysilicon, is filled in that contact hole 36, and the bit line BL is formed. Also, the $SiO_2$ layer 38 is formed on top of the bit line BL.

The $SiO_2$ layer 40 and the $Si_3N_4$ layer 42 for protecting the foundation layer are formed on top of the $SiO_2$ layer 34 and the $SiO_2$ layer 38, a through hole 44 that reaches the plug 32 is formed in a portion of this $Si_3N_4$ layer 42, $SiO_2$ layer 40, and $SiO_2$ layer 34, and the polysilicon layer 46 is formed in this through hole 44. A cylindrical polysilicon layer 48 is formed contacting this polysilicon layer 46, and the lower capacitor electrode is constructed by means of these polysilicon layers 46, 48. Also, a dielectric film, for example, the $Si_3N_4$ film 50, is adhered on the surface of the polysilicon layers 46, 48, and the upper capacitor electrode (plate electrode) made up of the polysilicon layer 52 is formed on top of this $Si_3N_4$ film 50.

In this way, the capacitor Cap made up of the upper and lower capacitor electrodes 52, 48 and 46 and the dielectric film 50 is connected to the source region 26 by means of the plug 32. The cross section of the memory cell MCA and the like shown in FIG. 5 is partially simplified in order to simplify the explanation.

As will be explained later, since the back bias VBB (for example, -1.0 V) for the purpose of optimizing the pause characteristics of the memory cell is applied to the substrate (P well 14) in which the memory cell MC is formed, in regard to the threshold voltage of the MOS transistors WL, 22, 26, 28 of the memory cell MC, it is not necessary to match these to the conditions for the other regions (peripheral circuit section), and these can be designed according to the specific conditions of the memory cell.

Again, in FIG. 3, in addition to the unit memory cell array MA such as was mentioned above, a portion of the sense amplifier bank SAB, in other words, the N-type MOS transistor group within the elements that construct the sense amplifier SA, is also connected to the P well 14. Also, the remaining portion of the sense amplifier bank SAB, in other words, the P-type MOS transistor group within the elements that construct the sense amplifier SA, is connected to the N well 16.

In this type of well construction, a back bias of the voltage VPP (for example, 3.8 V) is applied to the N deep well 12 by means of the N well (not illustrated) of the word line driver bank WDB. Here, VPP is equivalent to the power supply voltage VPP used for the word line drive that is supplied to the P-type MOS transistor that is formed in the N well of the word line driver bank, and VPP is also applied as a back bias to the N well of the word line driver bank WDB.

A back bias VBB (for example, -1.0 V) is supplied to the P well 14 for the purpose of optimizing the pause characteristics of the memory cells within unit memory cell array MA, and a back bias of VPP (3.8 V) that is the same as that applied to the N deep well 12 is supplied to the N well 16.

In this way, in this embodiment, the back bias for each well is made common according to the conductor type (P-type/N-type), and along with a common back bias VPP corresponding to the power supply voltage VPP for the word line driver being applied to the N deep well 12 and each N well 16, a common back bias VBB according to the characteristics of the memory cells is applied to each P well, and by this means, the region PG used for well isolation can be eliminated.

However, there is a concern that the MOS transistors within the sense amplifier SA and the MOS transistors within the cross area CR undergo a substrate bias effect and that a deterioration of the operating capabilities are brought about due to this type of a common back bias VPP, VSS. In this embodiment, this point was considered, and the measures explained below were conducted.

Figure 6:
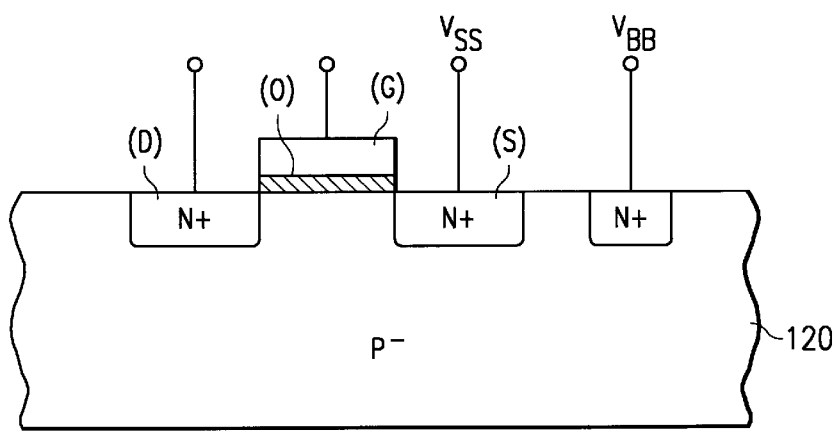
FIG. 6 is an abbreviated cross section showing, in the embodiment, the typical construction of an N-type MOS transistor that is formed in a P well and to which the back bias VBB is applied.
Figure 7:
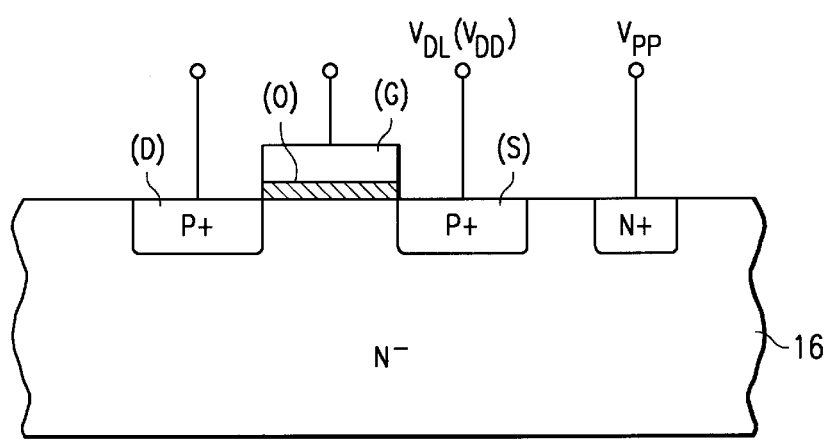
FIG. 7 is an abbreviated cross section showing, in the embodiment, the typical construction of a P-type MOS transistor that is formed in an N well and to which the back bias VPP is applied.

A typical construction of each N-type MOS transistor of the sense amplifier SA that receives the back bias VBB within the P well 14 is shown in FIG. 6. Also, a typical construction of each P-type MOS transistor of the sense amplifier SA that receives the back bias VPP within the N well 16 is shown in FIG. 7.

In the sense amplifier SA of this embodiment, a voltage that is higher than the back bias VBB (-1.0 V), for example, a sensing drive voltage VSS (for example, 0 V) of the L level side is applied to the source S of each N-type MOS transistor within the P well 14, and a voltage that is lower than the back bias VPP (3.8 V), for example, the sensing drive voltage VDL (for example, 2.2 V) or VDD (3.3 V) of the H level side is applied to the source S of each P-type MOS transistor within the N well 16.

Therefore, in these types of N-type MOS transistors within the P well 14 and P-type MOS transistors within the N well (16th), each of the threshold voltages are raised due to the substrate bias effect.

In other words, due to the fact that a reverse bias (-1.0 V) is applied between the $N^+$source S and the P well 14 (substrate) at the N-type MOS transistors within the P well 14, the depletion layer of the substrate is widened, and the threshold voltage increases.

Also, due to the fact that a reverse bias (0.5 to 1.6 V) is applied between the $P^+$source S and the N well 16 (substrate) at the P-type MOS transistors within the N well 16, in the end the depletion layer of the substrate is widened, and the threshold voltage is increased.

Thus, in this embodiment, the respective original threshold voltages are set beforehand to a low value so that the above-mentioned type of substrate bias effect is canceled in regard to the MOS transistors that construct the sense amplifiers SA.

For example, the threshold voltage VTH for the N-type MOS transistors can be found with the following Equation 1.

$$VTH=VTH(0)+K[\{2\phi BP+(VBB-VSS)\}^{1/2}-(2\phi BP)^{1/2}] \qquad (1)$$

Here, VTH (0) is the threshold voltage (original threshold voltage) when there is no substrate bias effect, in other words, when the potential difference (VBB–VSS) between the source (S) and the substrate is zero. Also, $\phi$BP is the Fermi level of the Si substrate (in this embodiment, P well 14), and K is the substrate bias effect coefficient.

An equation that is essentially the same as the above-mentioned Equation 1 can also be applied in regard to the threshold voltage VTH of the P-type MOS transistor.

Therefore, in this embodiment, the original threshold VTH (0) for each MOS transistor of the sense amplifier SA is set beforehand to a low value so that the desired threshold voltage VTH can be obtained under the substrate bias effects due to the back bias VBB, VPP.

In the vicinity of the boundary of the cross area CR, the unit memory cell array MA, and the word line driver bank WDM, the cross section is the same as FIG. 3, and the same type of a back bias as mentioned above is applied to each well section.

Therefore, even at each MOS transistor that is arranged within the cross area CR, each of the original threshold voltages VTH (0) are set beforehand to a low value so that the desired threshold voltage VTH can be obtained under the substrate bias effect due to the back bias VBB, VPP.

Figure 8:
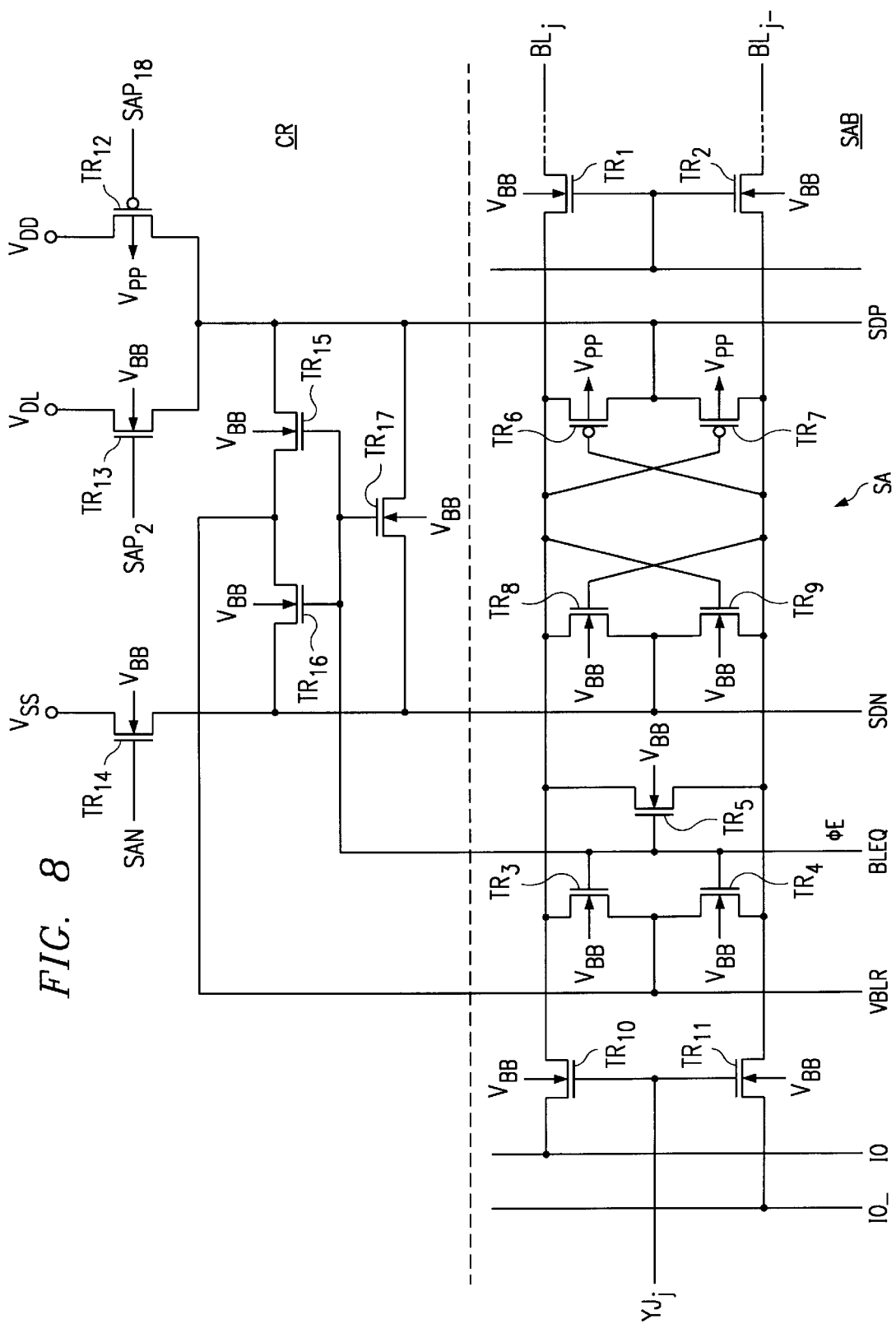
FIG. 8 is a circuit diagram showing a circuit construction example of a sense amplifier and a sense amplifier drive section in the embodiment.

A circuit construction example for the sense amplifier and the sense amplifier drive section of this embodiment is shown in FIG. 8. The sense amplifier drive section is installed in the cross area CR.

In this sense amplifier circuit, the pair of N-type MOS transistors TR1, TR2 construct transistor gates for conditionally connecting the bit line pairs BLj, BLj- to this sense amplifier S/A [sic; SA]. The three N-type MOS transistors TR3, TR4, TR5 construct a precharge circuit for precharging the bit line pairs BLj, BLj- to the desired potential, for example, the power supply voltage intermediate potential VDL/2. One pair of P-type MOS transistors TR6, TR7 and one pair of N-type MOS transistors TR8, TR9 construct amplifier circuits for respectively amplifying the presense voltages on the bit line pairs to their respective desired levels. One pair of N-type MOS transistors TR10, TR11 construct transfer gates for conditionally connecting the bit line pairs BLj, BLj- to the data input/output line pairs IO, IO-.

In the cross area CR, the P-type MOS transistor TR12 is the first H level side driver used for the sense amplifier drive, its source terminal is connected to the VDD (3.3 V) power source line, its drain terminal is connected by means of the sensing drive line SDP to the source terminal of the above-mentioned P-type MOS transistors TR6, TR7 that construct one of the amplifier circuits within the sense amplifier (S/A), and the drive control signal SAP1B is applied to its gate terminal.

The N-type MOS transistor TR13 is the second H level side driver used for the sense amplifier drive, its drain [sic; source] terminal is connected to the VDL (2.2 V) power supply line, its drain terminal is connected by means of the sensing drive line SDP to the source terminal of the above-mentioned P-type MOS transistors TR6, TR7, and the drive control signal SAP2 is applied to its gate terminal.

The N-type MOS transistor TR14 is the L level side driver used for the sense amplifier drive, its source terminal is connected to the VSS (0 V) power supply line, its drain terminal is connected by means of the sense amplifier drive line SDN to the source terminals of the above-mentioned N-type MOS transistors TR6, TR7 [sic; TR8, TR9] that construct the other amplifier circuit within the sense amplifier S/A, and the drive control signal SAN is applied to its gate terminal.

Also, the 3 N-type MOS transistors TR15, TR16, TR17 that are formed within the cross area CR construct an equalizer circuit for the purpose of maintaining the sense amplifier drive lines SDP, SDN at the same potential as the bit line pair precharge potential VDL/2 under the precharge conditions.

In a sense amplifier SA of this type of construction, a back bias VBB (−1.0 V) is applied to each N-type MOS transistor that is formed in the unit memory cell array MA and the common P well 14, and a back bias VPP (3.8 V) is applied to each P-type MOS transistor that is formed in the N deep well 12 and the N well 16 that is short-circuited.

Also, in regard to all of the elements that are arranged in the cross area CR, in the same manner, the back bias VBB is applied to each N-type MOS transistor, and the back bias VPP is applied to each P-type MOS transistor.

Figure 9:
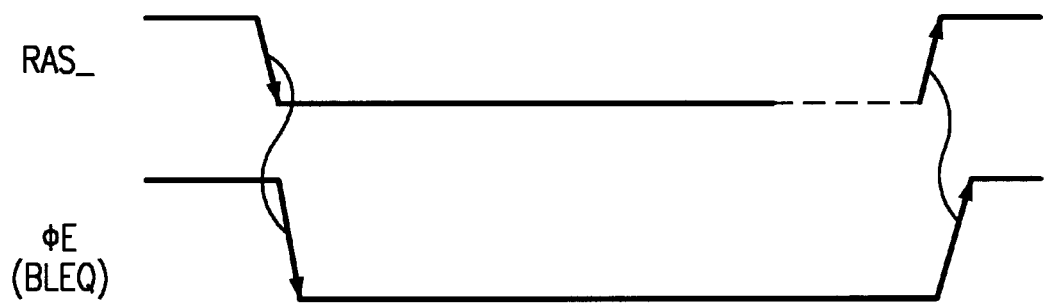
FIG. 9 is a timing chart for the purpose of explaining the operation of the sense amplifier and the sense amplifier drive section in the embodiment.
Figure 9:
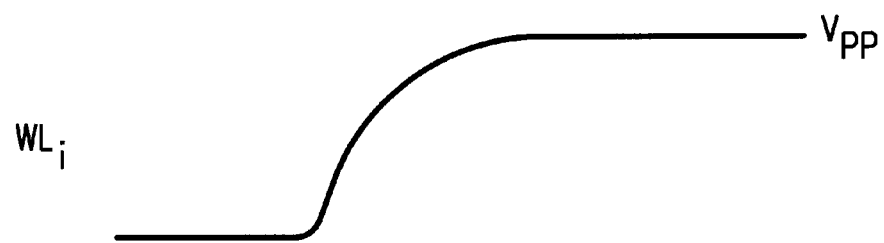
Figure 9:
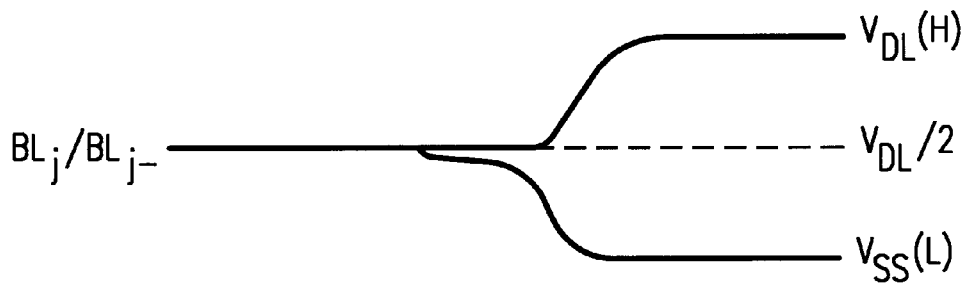
Figure 9:
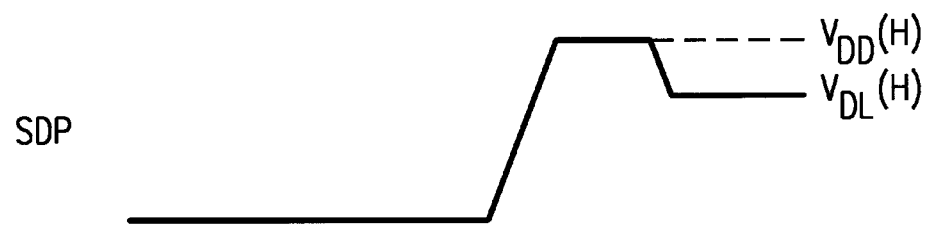
Figure 9:
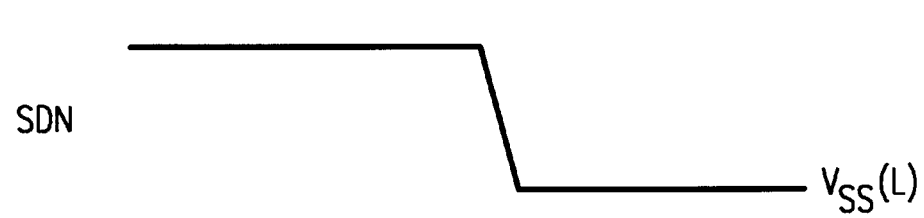

Next, the operation of this sense amplifier and the sense amplifier drive section is explained based on the timing chart of FIG. 9.

In the standby condition before reading or writing, the equalizer control signal φE is at the H level, all of the N-type MOS transistors TR3, TR4, TR5 of the precharge circuit of the sense amplifier SA are in the ON state, and all of the N-type MOS transistors TR15, TR16, TR17 of the equalizer circuit for the cross area CR side are in the ON state. On the other hand, a voltage at the VDL/2 level is supplied to the precharge supply line VBLR. By this means, the bit line BLj and the bit complementary line BLJ- that are connected to this sense amplifier S/A are in an equalized (equilibrium or short-circuit) state and are precharged to the VDL/2 level (about 1.1 V), and the sensing drive lines SDP, SDN are also precharged to the VDL/2 level (about 1.1 V). The drive control signals SAP1B, SAP2, SAN are at the H level, L level, L level, respectively, and the drivers TR12, TR13, TR14 are in the OFF state.

When the external row address strobe signal RAS- drops to the L level for reading or writing, in reaction to this, the equalizer control signal φE drops to the L level, all of the precharge transistors TR3, TR4, TR5 within the sense amplifier SA become in the OFF state, and all of the equalizer transistors TR15, TR16, TR17 of the cross area CR side also become in the OFF state.

Next, the word line WLi for the selected column is activated by means of the word line driver WD, and is pulled up to the level of the voltage VPP. By this means, the voltage information (storage information) of the memory cell MCi,j that is connected to that word line WLi is read from one of the bit line pairs, for example, bit line BLj, and the potential of that bit line BLj is changed. In the example of FIG. 9, the potential information is "0", and the potential of the bit line BLj is changed from the VDL/2 level to a slightly lower level.

Next, the drive control signals SAP1B, SAN change to the an L level and H level, respectively, and the transistors TR12, TR14, respectively, are turned ON. By this means, one of the sense amplifier drive lines SDN is pulled down from the precharge level VDL/2 to ground potential VSS (0 V), and the other sense amplifier drive line SDP is pulled up from the precharge level VDL/2 to the power supply voltage VDD (3.3 V).

In the case of this example, because the potential of the bit line BLj is changed from the VDL/2 level to a lower one, the P-type MOS transistor TR7 is turned ON. When this is done, the complementary bit line BLj- is connected to the sense amplifier drive line SDP by means of this transistor TR7 that has been turned on, and the potential of the complementary bit line BLj- is pulled up to the H level side at the power supply voltage VDD used for overdrive. On the other hand, the N-type MOS transistor TR8 is turned ON due to the fact that the potential of the complementary bit line BLj- has been raised by turning ON the transistor TR7, the bit line BLj is connected to the sense amplifier drive line SDN by means of the transistor TR8 that has been turned on, and the bit line BLj is pulled down to the L level side at the power supply voltage VSS.

Next, about the time that the potential of the complementary bit line BLj- has reached the level in the vicinity of the power supply voltage VDL (2.2 V), the drive control signal SAP1B changes to the H level at the prescribed time, and the drive control signal SAP2 changes the H level. Due to this, the driver TR12 is turned OFF, and conversely, the driver TR13 is turned ON. After that, until the sense amplifier operation is completed, a power supply voltage VDL at the normal H level is supplied from the driver TR13 in the ON state to the complementary bit line BLj- by means of the sense amplifier drive line SDP and the P-type MOS transistor TR7. The H level of the drive voltage control signal SAP2 is the voltage value of VPP (3.8 V).

Next, when the Y address line YSj is activated by means of the Y address decoder (not illustrated), the transfer gates TR10, TR11 are turned ON, and the bit line BLj and the complementary bit line BLj- are connected to the data input/output line IO and the complementary data input/output line IO-, respectively.

By this means, during reading, the data read from the memory cell MCi,j to the bit line BLj is sent to the data input/output line IO by means of the transfer gate TR1 and the transfer gate TR10. During writing, the data in the data input/output line IO are sent to the bit line BLj by means of the transfer gate TR10 and the transfer gate TR1, and are written into the pertinent memory cell MCi,j (the memory cell at the intersection point of the bit line BLj and the word line WLi.

In the above-mentioned type of sense amplifier operation, it is important that each MOS transistor operates stably and accurately. In particular, it is essential that the MOS transistors TR6 to TR9 of the sense amplifier amplifying circuit accurately detect and amplify the minute changes of the voltage information on the bit line pair.

Because of this, it is important that the threshold voltage VTH for each MOS transistor (in particular, (TR6 to TR9) of the sense amplifier amplifying circuit) be set to an optimum value. In this embodiment, all of the MOS transistors that construct the sense amplifiers SA and the sense amplifier drive sections receive a back bias VPP or VBB that changes to a reverse bias in relation to the source voltage, and the respective threshold voltages VTH are raised due to the substrate bias effect. However, since the respective original threshold voltages VTH (0) are set beforehand to a low value so that this type of substrate bias effect is canceled, the respective threshold voltages VTH become an optimum value at less than the back bias VPP or VBB, and becomes such that each MOS transistor conducts the prescribed operations stably and accurately.

Figure 10:
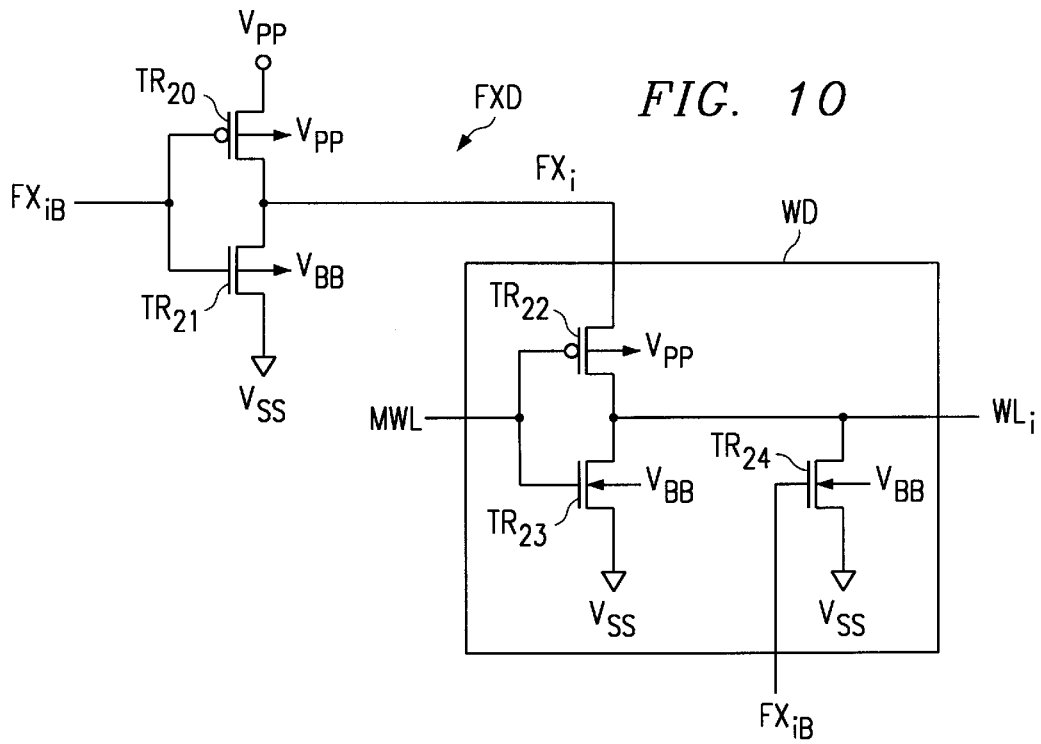
FIG. 10 is a circuit diagram showing a circuit construction example of the word line drive section in the embodiment.
Figure 14:
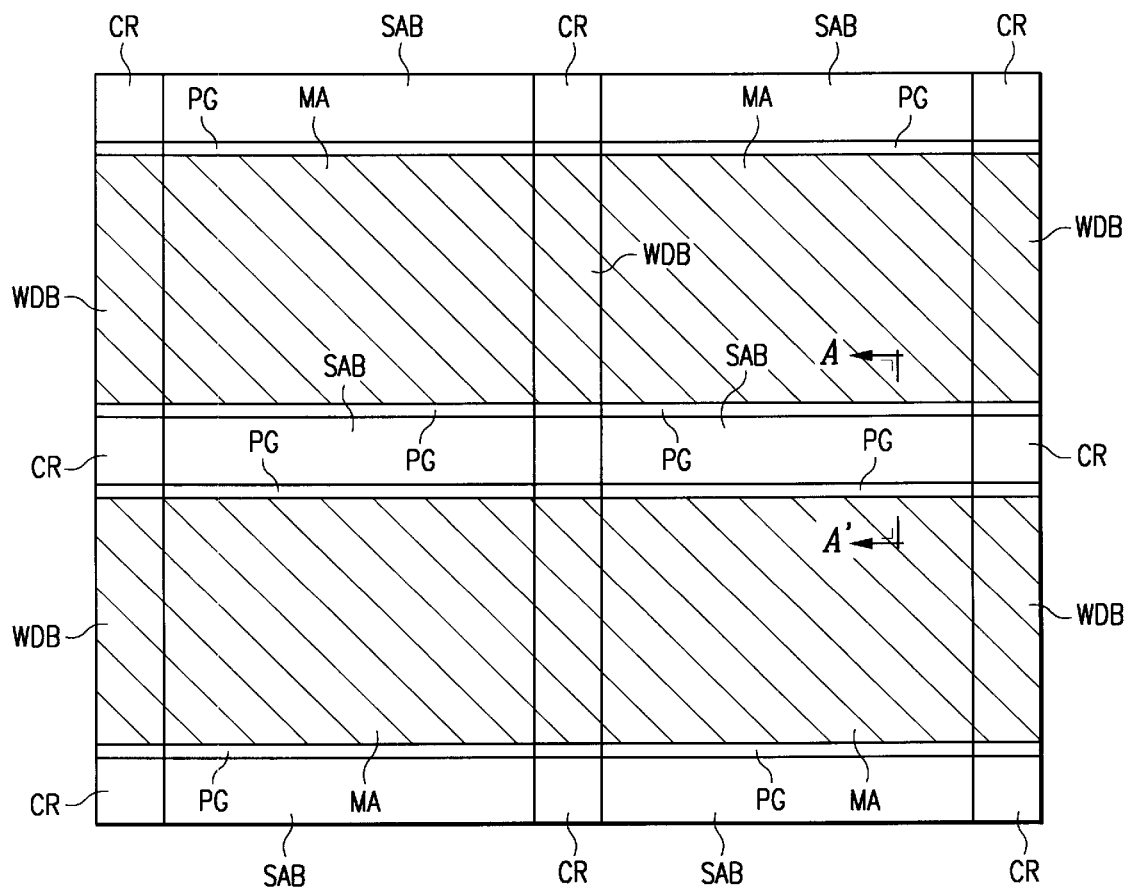
FIG. 14 is a figure showing in planar view the area in which deep well is distributed in a DRAM used in the past.
Figure 11:
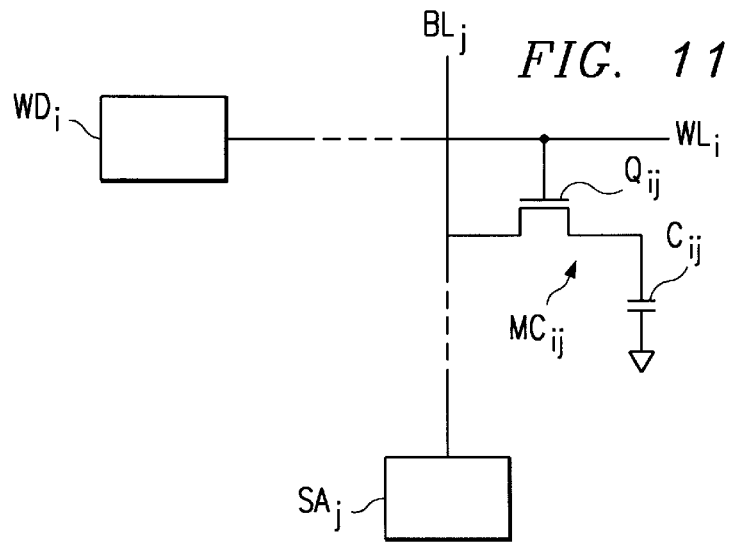
FIG. 11 is a figure showing a typical circuit and connections for the memory cell in a DRAM.
Figure 12:
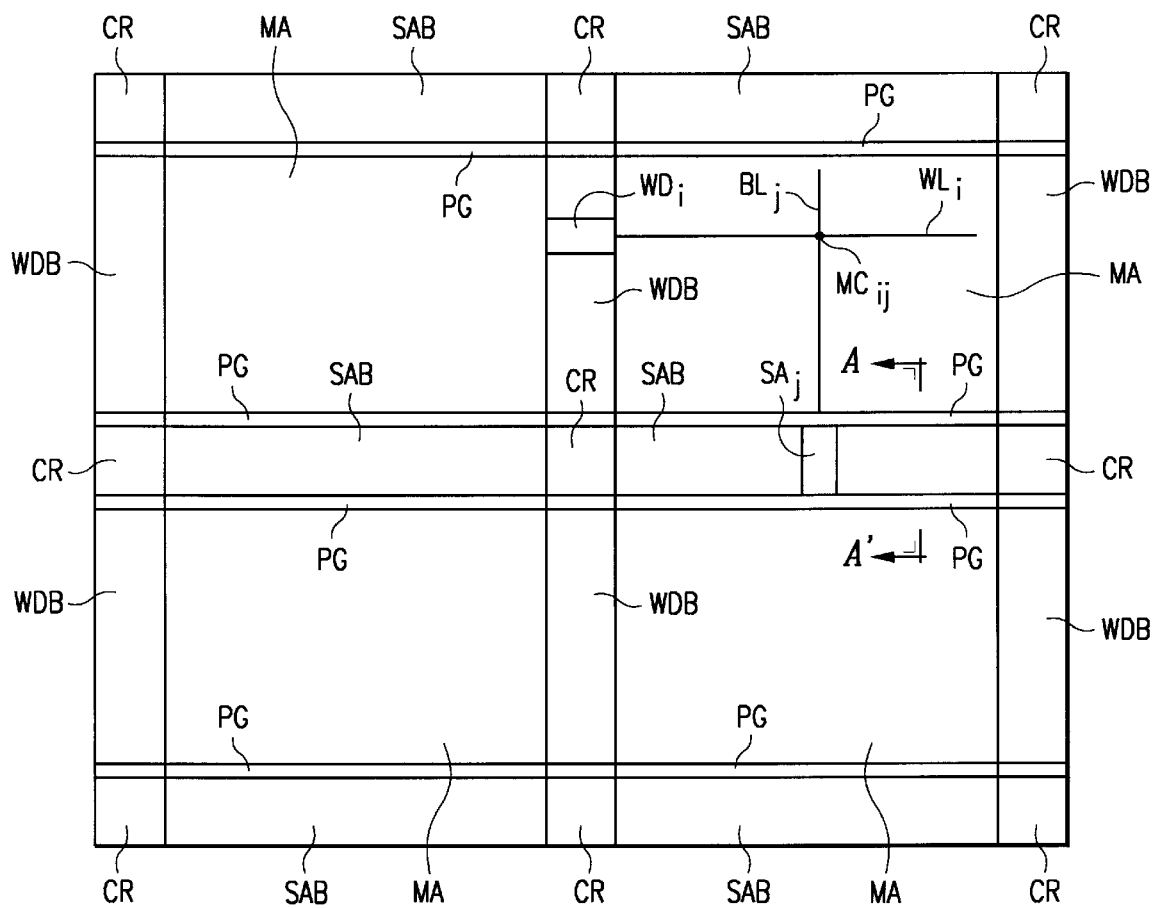
FIG. 12 is a figure showing the layout of a unit memory cell array section and peripheral circuit section in a DRAM used in the past.
Figure 13:
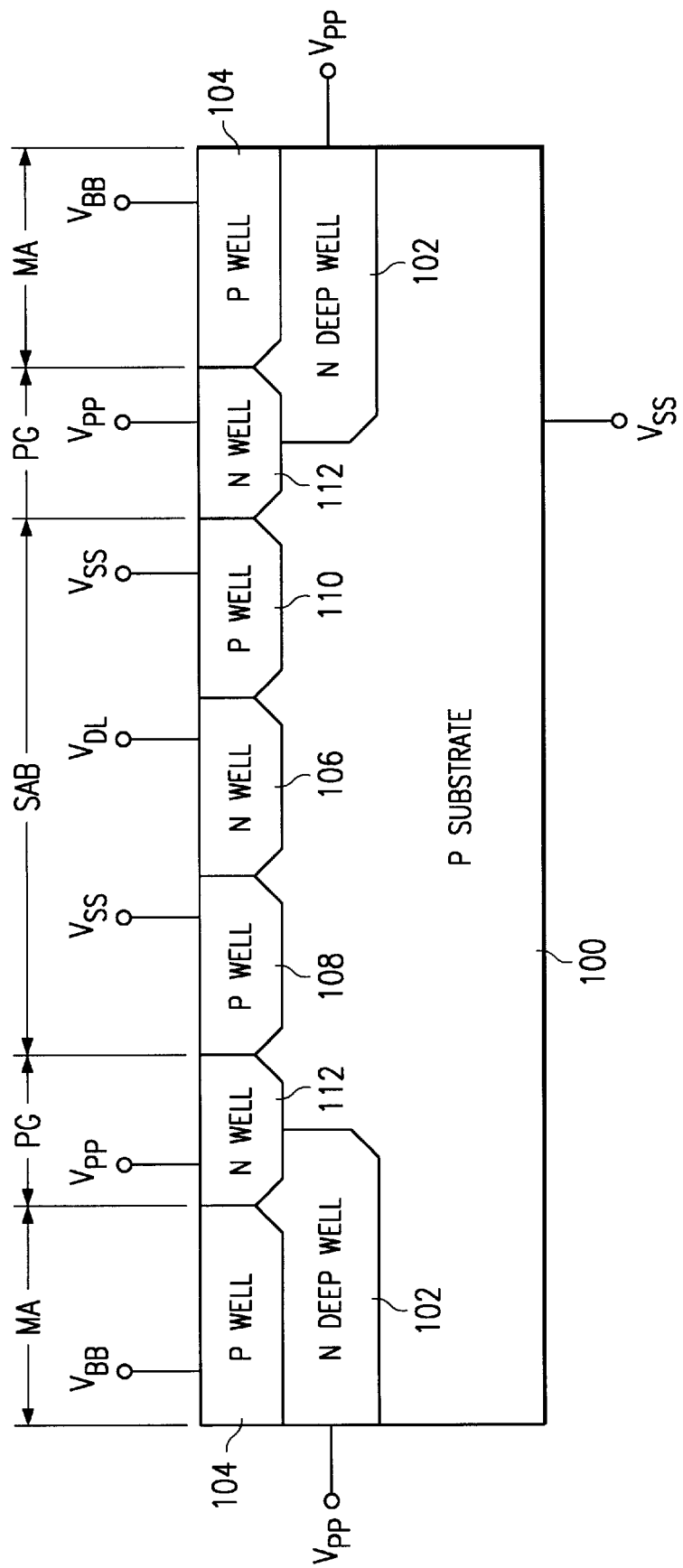
FIG. 13 is an abbreviated cross-sectional view of FIG. 12 through line A—A'.

Circuit construction examples of a word line driver WD and an FX driver FXD are shown in FIG. 10.

The FX driver FXD is made up of a CMOS inverter, and inverts and outputs a transistor drive signal FXiB from the array controller AC. Then, when a drive signal FXi at the H level is output, the P-type MOS transistor TR20 is turned on, the level of the power supply voltage VPP (3.8 V) is output, and when a drive signal FXi at the L level is output, the N-type MOS transistor TR21 is turned ON, and the level of the power supply voltage VSS (0 V) is output.

This FX driver FXD is installed in the cross area CR, its P-type MOS transistor TR20 is formed in the N well 16, and its N-type MOS transistor TR21 is formed in the P well 14. Therefore, the back bias VPP is applied to the P-type MOS transistor TR20, and the back bias VBB is applied to the N-type MOS transistor TR21.

The word line driver WD is constructed of a single CMOS circuit TR22, TR23 and a single N-type MOS transistor TR 24. The main word line MWL from the array controller AC is connected to the input terminal of the CMOS circuit TR22, TR23, and the word line WL is connected to the output terminal of the CMOS circuit TR22, TR23. The output signal FXi from the corresponding FX driver FXD is applied to the source of the P-type MOS transistor TR22 of the CMOS circuit. The transistor drive signal FXiB from the array controller AC is applied to the gate of the N-type MOS transistor TR23.

The N-type MOS transistors TR23, TR24 are formed in the P well 14, and the P-type MOS transistor TR22 is formed in the N well (not illustrated) that is adjacent to said P well 14. Also, the back bias VPP is applied to the P-type MOS transistor TR22, and the back bias VBB is applied to the N-type MOS transistors TR23, TR24.

In this type of construction, when both the main word line MWL and the transistor drive signal FXiB are at the L level, N-type MOS transistors TR21, TR23, TR24 are all in the OFF state, the P-type MOS transistors TR20, TR22 are both turned ON, and the word line WL is energized to the VPP level. When at least one of either the MWL or the FXiB change to the H level, at least one of the P-type MOS transistors TR20, TR22 is turned OFF, and at least one of the N-type MOS transistors TR21, TR24 and TR23 is turned ON, and the word line WL is maintained at the level of VSS.

In this word line driver WD and FX driver FXD, because the back bias VPP is equal to the voltage VPP of the source side, the P-type MOS transistors TR20, TR22 do not undergo the substrate bias effect. On the other hand, because the back bias VBB (−1.0 V) is lower than the voltage VSS (0 V) of the source side, the N-type MOS transistors TR21, TR23, TR24 undergo the substrate bias effect. However, as for the word line operation, because there is no demand for a minute operation such as sensing, it is possible to omit the regulation of the threshold value voltage for these N-type MOS transistors TR21, TR23, TR24. Understandably, according to this embodiment, even in these N-type MOS transistors TR21, TR23, TR24, it is possible to design the original threshold VTH (0) beforehand to a low value.

In the above-mentioned embodiment, because a P-type silicon substrate is used, the deep well layer was made the N-type, but a deep well construction is also possible in which these polarities are reversed, and a P-type deep well layer is provided on an N-type silicon substrate. In the above-mentioned embodiment, regulation or compensation was conducted for the threshold voltages for all of the MOS transistors that construct the sense amplifiers and the sense amplifier drive sections, but it is also possible to conduct the above-mentioned type of threshold voltage regulation for only a portion of the MOS transistors. Also, it is possible to interpose an isolation region in optional well boundary sections. This invention is suitable for application in a DRAM construction such as the above-mentioned embodiment, but it is also suitable for other semiconductor devices.

As was explained above, according to the semiconductor device of this invention, in the deep well construction, a common deep well (semiconductor layer) was distributed on the entire surface under each deep well section of the surface layer, and along with applying a back bias of the same potential to said deep well and the wells of the same semiconductor type as this, a back bias of a potential that was different than the above-mentioned back bias was applied to the wells of the other semiconductor type, and since the threshold was designed so as to cancel the substrate bias effect in which the above-mentioned back bias originates for optional MOS transistors within each well, the regions used for well isolation is rendered unnecessary, and a reduction of the layout surface area can be realized.

We claim:

1. A semiconductor device having
   a semiconductor substrate of a first conductor type,
   a semiconductor layer of a second conductor type that is formed on the above-mentioned semiconductor substrate,
   one or multiple semiconductor regions of the first semiconductor type and one or multiple semiconductor regions of the second conductor type that are aligned on top of the above-mentioned semiconductor layer isolated from the above-mentioned semiconductor substrate,
   one or multiple MOS transistors of the second semiconductor type that are formed within the respective semiconductor regions of the above-mentioned first semiconductor type,
   one or multiple MOS transistors of the first semiconductor type that are formed within the respective semiconductor regions of the above-mentioned second semiconductor type, along with applying a common first back bias to the respective semiconductor regions of the above-mentioned first conductor type, a common second back bias is applied to the above-mentioned semiconductor layer and the respective semiconductor regions of the above-mentioned second conductor type, and along with being designed so that, in at least one of the semiconductor regions of the above-mentioned first conductor type, the threshold voltage for the MOS transistor of at least one of the above-mentioned MOS transistors of the second conductor type cancels the substrate bias by means of the above-mentioned first back bias, and in at least one of the semiconductor regions of the above-mentioned second conductor type, the threshold voltage for at least one of the MOS transistors of the above-mentioned first conductor type cancels the substrate bias effect by means of the above-mentioned second back bias.

2. The semiconductor device recorded in claim 1 wherein a single memory cell array section and a section of one or multiple peripheral circuit sections that are connected to the above-mentioned memory cell array section are contained within at least one of the semiconductor regions of the above-mentioned first conductor type, and is designed so that the threshold voltage of at least one of the MOS transistors of the above-mentioned second conductor type of the above-mentioned peripheral section cancels the substrate bias effect by means of the above-mentioned first back bias.

3. The semiconductor device recorded in claim 2 wherein the remaining portion of the above-mentioned peripheral circuit section is provided within the semiconductor region of the above-mentioned second conductor type that is adjacent to a portion of the region of the above-mentioned peripheral circuit that is formed within the semiconductor region of the above-mentioned first conductor type, and is designed so that the threshold voltage of at least one of the MOS transistors of the above-mentioned first conductor type of the above-mentioned peripheral circuit section cancels the substrate bias effect by means of the above-mentioned second back bias.

* * * * *